United States Patent

[11] 3,590,342

[72] Inventor Hans J. Jekat
Redwood City, Calif.
[21] Appl. No. 773,737
[22] Filed Nov. 6, 1968
[45] Patented June 29, 1971
[73] Assignee Hewlett-Packard Company
Palo Alto, Calif.

[54] MOS INTEGRATED CIRCUIT WITH REGIONS OF GROUND POTENTIAL INTERCONNECTED THROUGH THE SEMICONDUCTOR SUBSTRATE
3 Claims, 3 Drawing Figs.

[52] U.S. Cl. .................................................... 317/235, 317/234, 307/304
[51] Int. Cl. .................................................... H01l 11/14
[50] Field of Search .......................................... 317/235

[56] References Cited
UNITED STATES PATENTS

| | | | |
|---|---|---|---|
| 3,423,650 | 1/1969 | Cohen .......................... | 317/234 |
| 3,440,500 | 4/1969 | Coppen.......................... | 317/235 |
| 3,383,570 | 5/1968 | Luscher.......................... | 317/235 |

*Primary Examiner*—John W. Huckert
*Assistant Examiner*—Martin H. Edlow
*Attorney*—Rolandi I. Griffin

ABSTRACT: In a P-channel MOS integrated circuit each active P+-type region to be operated at ground potential is connected by a conductor to an adjacent N+-type region in the N-type substrate thereby interconnecting these active regions through the substrate.

INVENTOR
HANS J. JEKAT
BY Roland D. Griffin
ATTORNEY

MOS INTEGRATED CIRCUIT WITH REGIONS OF GROUND POTENTIAL INTERCONNECTED THROUGH THE SEMICONDUCTOR SUBSTRATE

BACKGROUND AND SUMMARY OF THE INVENTION

In most MOS integrated circuits the diffused active regions, such as $P^+$-type source or drain regions, to be operated at ground potential are interconnected either by a ground path diffused into the semiconductor body of the integrated circuit or by a metal ground conductor formed upon an insulating layer on the surface of the integrated circuit. One disadvantage of a diffused ground path is that it must be relatively wide in order to keep its resistance per square small. This substantially reduces the packing density of the integrated circuit. Another more important disadvantage of a diffused ground path is that parasitic MOS action may produce undesired current paths between the diffused ground bus and other diffused regions operated at a more negative potential. One disadvantage of a metal ground conductor is the difficulty in forming it upon the uneven surface of the integrated circuit without breaks or pinholes and without shorting out other portions of the integrated circuit such as through breaks and pinholes in the insulating layer on which it is supported. Another important disadvantage of such a ground conductor is that it increases the difficulty in providing the necessary interconnections of the integrated circuit without reducing its packing density.

According to the preferred embodiment of this invention, as illustrated in the context of a P-channel MOS integrated circuit, the active $P^+$-type regions to be operated at ground potential are interconnected through the N-type substrate by conductively connecting each of them to an adjacent $N^+$-type region formed in the substrate. This eliminates the need for employing either diffused ground paths or metal ground conductors and thereby improves both the packing density and the reliability of the integrated circuit while minimizing the occurrence of parasitic MOS action.

DESCRIPTION OF THE PREFERRED EMBODIMENT

Figures 1, 2:
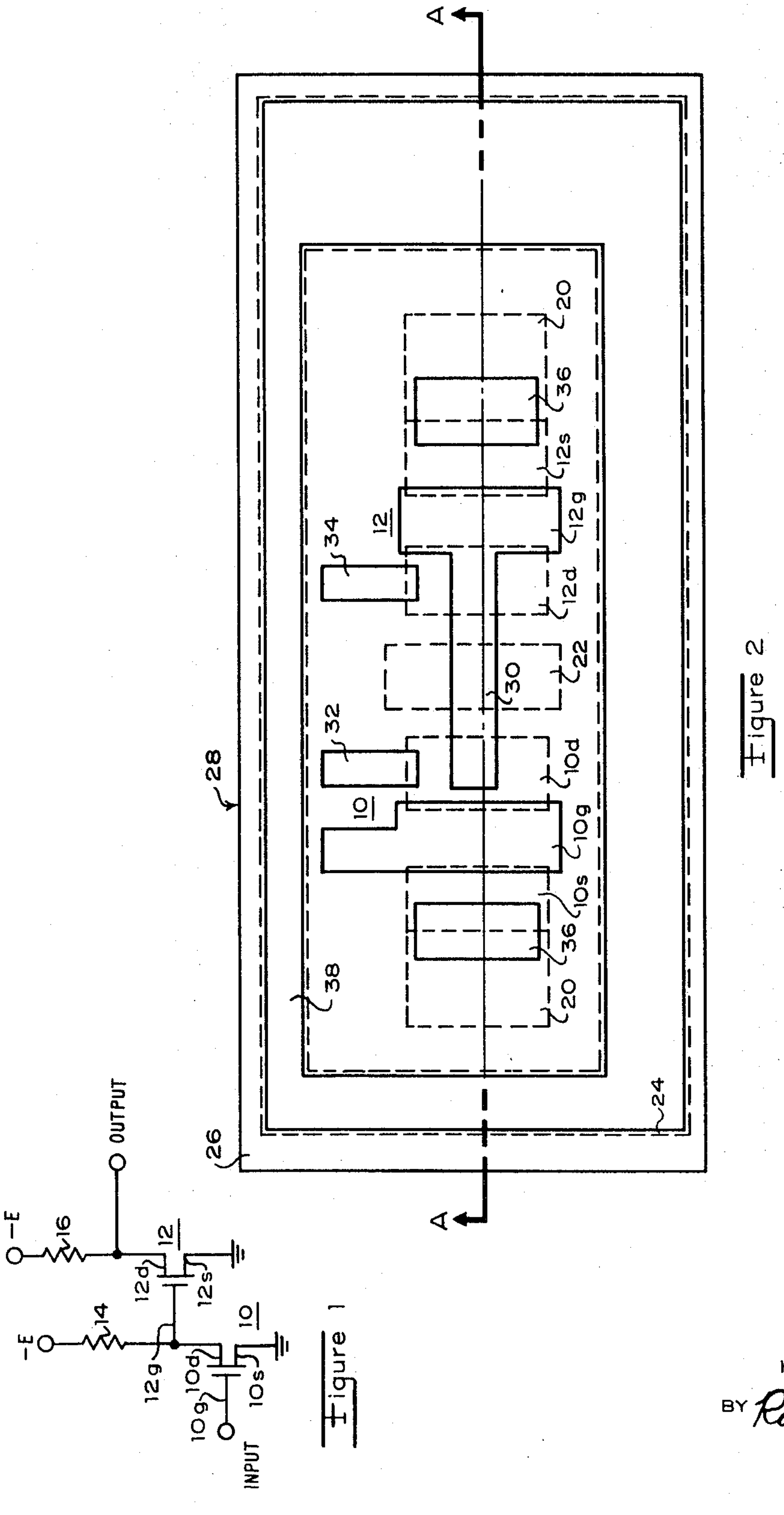
FIG. 1 is a schematic diagram illustrating a typical MOS integrated circuit.
FIG. 2 is a plan view illustrating the preferred embodiment of this invention in the context of a P-channel MOS integrated circuit such as that shown schematically in FIG. 1.

Referring now to FIG. 1, there is shown schematically an MOS integrated circuit such as a cascaded inverter circuit in which the drain 10*d* of a first MOS inverter 10 is connected to the gate 12*g* of a second MOS inverter 12. In this circuit the gate 10*g* of the first inverter serves as the input, and the drain 12*d* of the second inverter serves as the output. The drains 10*d* and 12*d* of the inverters are respectively connected by load resistors 14 and 16 to a source of supply potential −E, and the sources 10*s* and 12*s* of the inverters are both connected to a source of reference potential such as ground.

Figure 3:
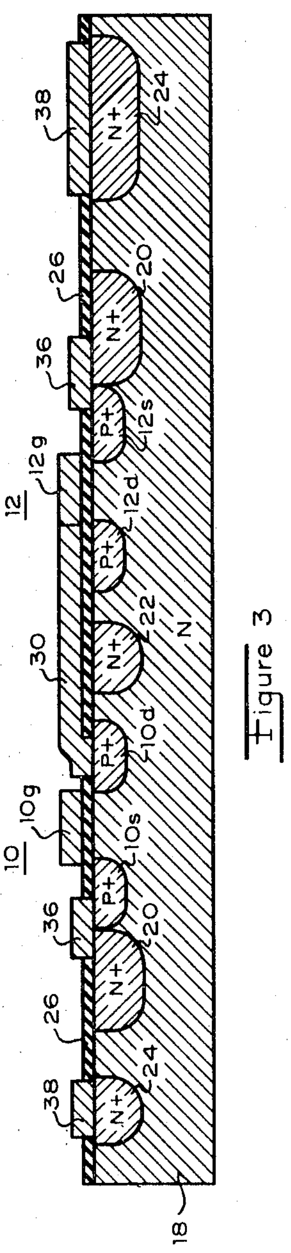
FIG. 3 is a sectional elevational view taken along the line A–A of FIG. 2.

As shown in FIGS. 2 and 3, a P-channel MOS integrated circuit such as that of FIG. 1 may be formed with a lightly doped N-type silicon wafer 18 having a resistivity of about 3 ohms per cubic centimeter. Heavily doped $N^+$-type contact regions 20 having a surface concentration of about $10^{20}$ atoms per cubic centimeter are formed in wafer 18 adjacent to the regions where grounded portions of the integrated circuit, such as the sources 10*s* and 12*s* of inverters 10 and 12, are to be formed. A similarly doped $N^+$-type suppressor region 22 is also formed in wafer 18 in the path of each undesired current path that might be formed between a pair of adjacent active regions of different potentials, such as between the drain 10*d* of the first inverter 10 and the gate 12*g* of the second inverter 12, by parasitic MOS action. This use of a suppressor region to prevent parasitic MOS action from producing an undesired current path between adjacent active regions operated at different potentials is fully described in copending application Ser. No. 608,412 entitled MIS INTEGRATED CIRCUIT and filed on Jan. 10, 1967, by Kenneth J. Moyle and Hans J. Jekat. Another $N^+$-type contact region 24 is formed in wafer 18 around the entire region in which the integrated circuit is to be formed. All of these $N^+$-type regions may be formed at the same time by diffusing them to a depth of about five microns in wafer 18 through corresponding openings in an oxide masking layer formed on a plane upper surface of the wafer.

Heavily doped $P^+$-type active regions, such as the sources 10*s* and 12*s* and the drains 10*d* and 12*d* of inverters 10 and 12, having a surface concentration of about $10^{20}$ atoms per cubic centimeter are next formed in wafer 18. The source 10*s* and drain 10*d* of the first inverter 10 are spaced apart from one another on one side of the $N^+$-type suppressor region 22 with the source 10*s* positioned next to one of the $N^+$-type contact regions 20. Similarly, the source 12*s* and the drain 12*d* of the second inverter 12 are spaced apart from one another on the opposite side of the $N^+$-type suppressor 10 with the source 12*s* positioned next to another of the $N^+$-type contact regions 20. All of these $P^+$-type active regions 10*s*, 10*d*, 12*s*, and 12*d* may be formed at the same time by stripping the oxide masking layer employed for the $N^+$ diffusion from the plane upper surface of wafer 18 and by diffusing them to a depth of about four microns into the wafer through corresponding openings in a fresh oxide masking layer formed on its plane upper surface.

Next the oxide masking layer employed for the $P^+$ diffusion is stripped from the plane upper surface of wafer 18 and replaced by a high quality oxide layer 26 about 1200 A. in thickness. Openings are then formed in oxide layer 26 to expose contact portions of the $P^+$-type active regions 10*s*, 10*d*, 12*s*, and 12*d* and the $N^+$-type contact regions 20 and 24. The gate conductors 10*g* and 12*g* of inverters 10 and 12 are formed entirely on oxide layer 26 so that each gate conductor completely overlaps the gate region between its associated source 10*s* or 12*s* and drain 10*d* or 12*d*. Gate conductor 10*g* extends along oxide layer 26 towards one side 28 of wafer 18 to provide the input terminal for the integrated circuit. A conductor 30 is formed in contact with an exposed portion of the drain 10*d* of the first inverter 10 and in contact with the gate conductor 12*g* of the second inverter 12. Two conductors 32 and 34 are respectively formed in contact with another exposed portion of the drain 10*d* of the first inverter and the exposed portion of the drain 12*d* of the second inverter. Conductors 32 and 34 extend toward the side 28 of wafer 18 to provide terminals that may be connected by load resistors 14 and 16 to a source of negative supply potential −E as shown in FIG. 1. Conductor 34 also serves as the output terminal for the integrated circuit. A separate conductor 36 is formed in contact with the exposed portion of each $N^+$-type contact region 20 and the exposed portion of the adjoining $P^+$-type active source 10*s* or 12*s* that is to be operated at ground potential. An additional conductor 38 is formed on the exposed portion of the $N^+$-type contact region 24 to provide a ground terminal for the integrated circuit. All of these conductors may be formed at the same time by depositing a conductive metal layer about 5000 A. in thickness over the oxide layer 26 and by selectively etching away those portions of the conductive metal layer that are not needed to form the conductors of the integrated circuit.

Conductors 36, $N^+$-type contact regions 20, and the N-type substrate of wafer 18 provide a nonrectifying interconnection between the active source regions 10*s* and 12*s* to be operated at ground potential and the ground terminal 38. The resistance of this interconnection from each active source region 10*s* and 12*s* to the ground terminal 38 is primarily caused by the interface between each $N^+$-type contact region 20 and 24 and the N-type substrate and is therefore largely determined by the size and shape of the $N^+$-type contact regions 20 and 24. As the surface area of the $N^+$-type contact regions 20 and 24 is increased the resistance of the interconnection from the active source regions 10*s* and 12*s* to the ground terminal 38 decreases. In practice it has been found that the size and shape of the $N^+$-type contact regions 20 and 24 should be selected so that the resistance from the active region to be grounded to the ground terminal 38 does not exceed one one-hundred and fiftieth of the resistance of any load resistor, such as 14 or 16, for a 12 volt supply potential. This resistance may be as high as 600 ohms. However, such resistances are generally not significant in MOS integrated circuits, especially in comparison to the relatively high resistances (normally about 15K—100K ohms) of the load resistors conventionally employed in most MOS integrated circuits.

I claim:

1. An integrated circuit comprising:

a semiconductor substrate of a first conductivity type;

a plurality of regions of a second conductivity type disposed in said semiconductor substrate, said regions of the second conductivity type forming circuit elements including source and drain electrodes of MOS transistors;

a plurality of regions of the first conductivity type disposed in said semiconductor substrate immediately adjacent to selected ones of said regions of the second conductivity type, said regions of the first conductivity type being more heavily doped than said semiconductor substrate;

a separate conductor supported on the surface of the semiconductor substrate to connect each region of the first conductivity type to an adjacent selected one of said regions of the second conductivity type;

another region of the first conductivity type disposed in said semiconductor substrate around said first-mentioned regions of the first and second conductivity types, said other region of the first conductivity type being more heavily doped than said semiconductor substrate; and a conductive layer disposed in contact with said other region of the first conductivity type to provide a ground contact for connecting the integrated circuit to an external ground;

said semiconductor substrate providing a common ground bus to connect said selected ones of said regions of the second conductivity type to said other region of the first conductivity type.

2. An integrated circuit as in claim 1 wherein:

an insulating layer is supported on said semiconductor substrate, openings being provided in the insulating layer to allow contact to said regions of the first and second conductivity types; and a gate electrode is provided for each MOS transistor, each gate electrode comprising a conductive layer supported on said insulating layer above a region of said semiconductor substrate between an adjacent pair of source and drain electrodes.

3. An integrated circuit as in claim 2 wherein:

the semiconductor substrate is N conductivity type;

the regions of the first conductivity type are $N^+$ conductivity type; and the regions of the second conductivity type are $P^+$ conductivity type.